(12) United States Patent
Nishihara et al.

(10) Patent No.: US 8,084,919 B2
(45) Date of Patent: Dec. 27, 2011

(54) PIEZOELECTRIC THIN-FILM RESONATOR, FILTER USING THE SAME, AND DUPLEXER USING THE SAME

(75) Inventors: Tokihiro Nishihara, Kawasaki (JP); Motoaki Hara, Kawasaki (JP); Shinji Taniguchi, Kawasaki (JP); Takeshi Sakashita, Kawasaki (JP); Tsuyoshi Yokoyama, Kawasaki (JP); Masafumi Iwaki, Kawasaki (JP); Masanori Ueda, Kawasaki (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 212 days.

(21) Appl. No.: 12/535,186

(22) Filed: Aug. 4, 2009

(65) Prior Publication Data

US 2010/0033063 A1    Feb. 11, 2010

(30) Foreign Application Priority Data

Aug. 8, 2008   (JP) .................................. 2008-206089

(51) Int. Cl.
*H01L 41/09*   (2006.01)
(52) U.S. Cl. ...................................... 310/320; 310/324
(58) Field of Classification Search .................. 310/320, 310/324
See application file for complete search history.

(56) References Cited

U.S. PATENT DOCUMENTS

| 6,518,688 | B1 * | 2/2003 | Sasaki | 310/320 |
| 7,009,326 | B1 * | 3/2006 | Matsuo et al. | 310/324 |
| 7,364,275 | B2 * | 4/2008 | Lim et al. | 347/70 |
| 7,541,717 | B2 * | 6/2009 | Schmidhammer | 310/320 |
| 7,602,102 | B1 * | 10/2009 | Barber et al. | 310/320 |
| 2004/0140865 | A1 * | 7/2004 | Komuro et al. | 333/133 |
| 2006/0017352 | A1 * | 1/2006 | Tanielian | 310/324 |
| 2006/0103264 | A1 * | 5/2006 | Junhua | 310/324 |
| 2006/0214539 | A1 * | 9/2006 | Sato | 310/320 |
| 2007/0007859 | A1 * | 1/2007 | Weber | 310/324 |
| 2007/0252476 | A1 * | 11/2007 | Iwaki et al. | 310/320 |

FOREIGN PATENT DOCUMENTS

EP    1 850 478 A2    10/2007
JP    2007-300430 A    11/2007

* cited by examiner

*Primary Examiner* — Thomas Dougherty
(74) *Attorney, Agent, or Firm* — Arent Fox LLP

(57) ABSTRACT

A piezoelectric thin film resonator includes a substrate, a lower electrode formed on the substrate, a piezoelectric film formed on the lower electrode, and an upper electrode formed on the piezoelectric film, the lower electrode and the upper electrode opposing each other through the piezoelectric film to form an opposing region, the opposing region including a space at a boundary of the opposing region. The space extends from an innerside to an outer side of the opposing region and is formed in or on the piezoelectric film.

17 Claims, 11 Drawing Sheets

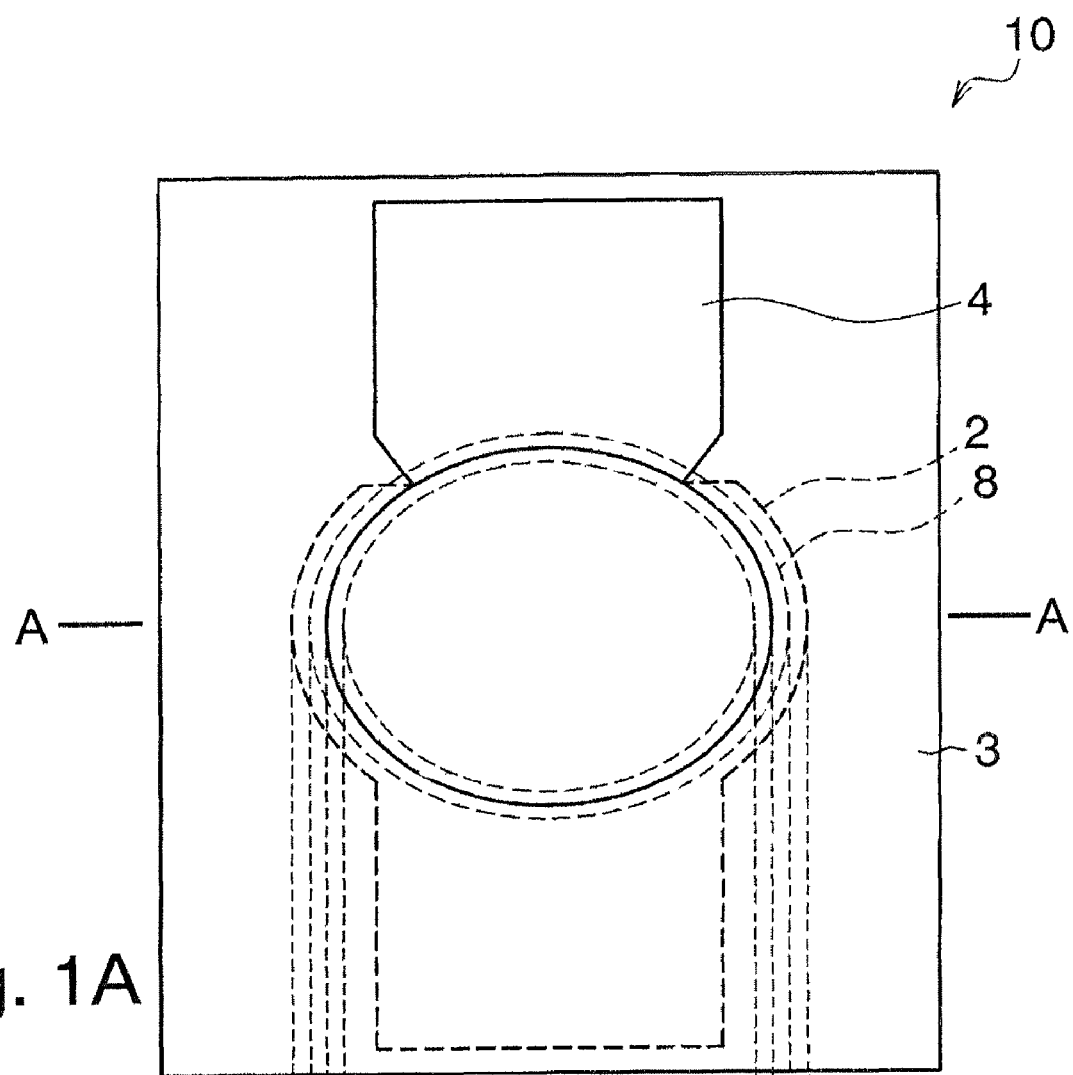
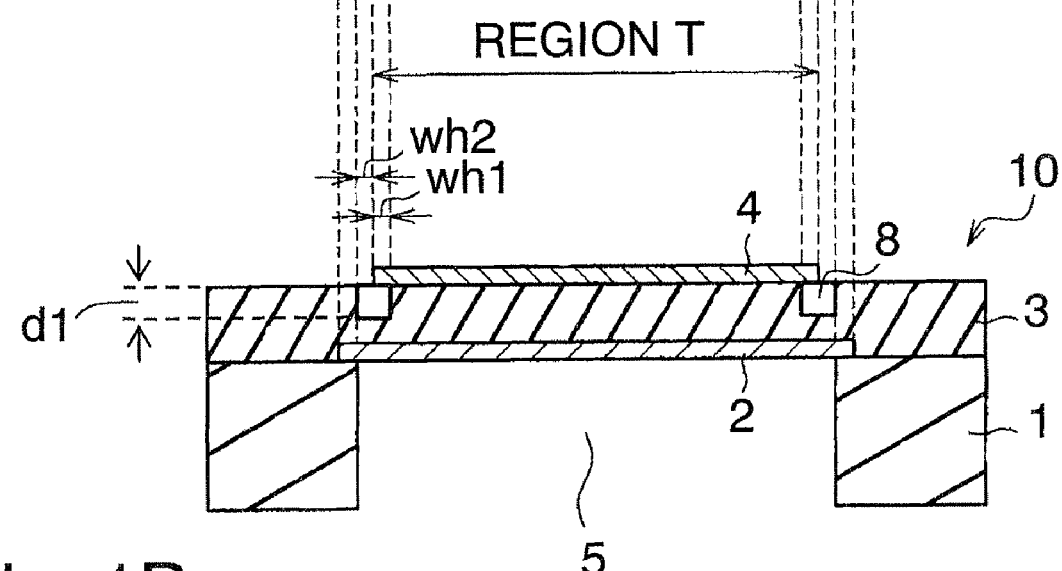
Fig. 1A
Fig. 1B

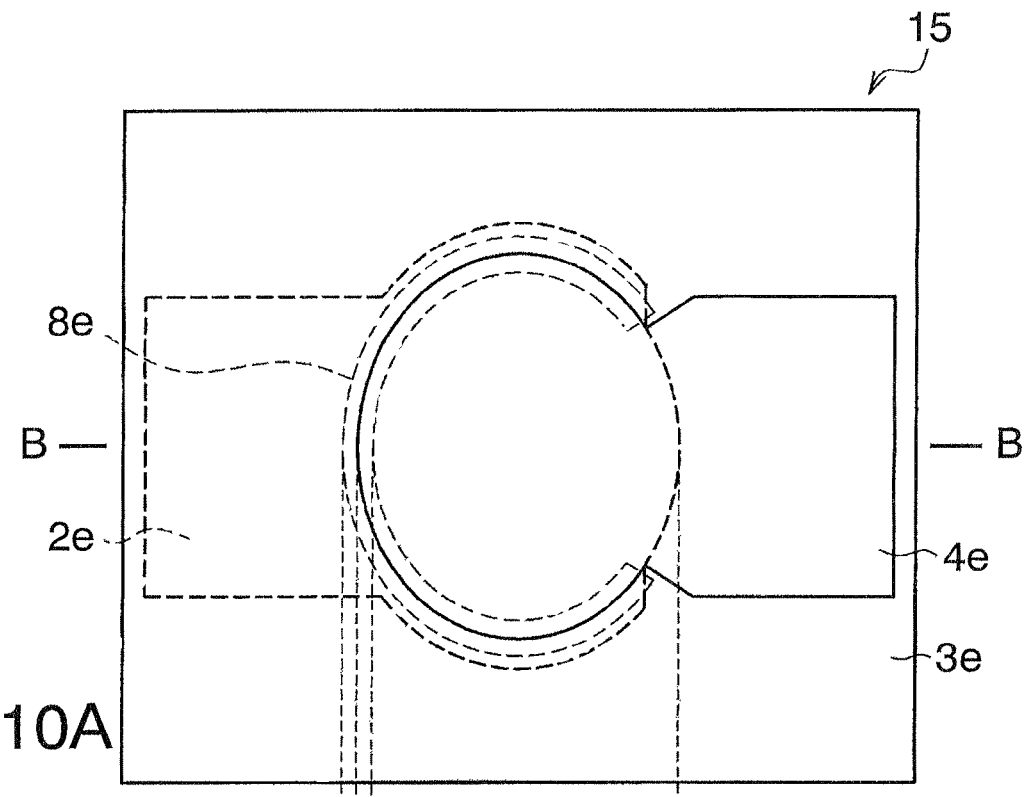
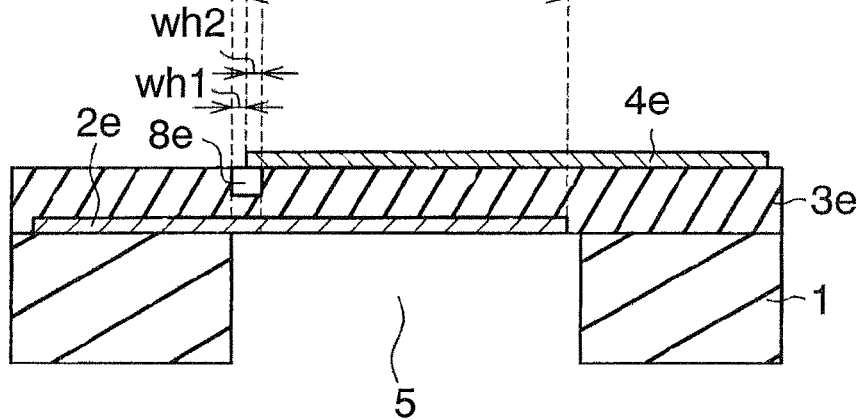
Fig. 10A
Fig. 10B

PIEZOELECTRIC THIN-FILM RESONATOR, FILTER USING THE SAME, AND DUPLEXER USING THE SAME

CROSS-REFERENCE TO RELATED APPLICATIONS

This application is based upon and claims the benefit of priority of the prior Japanese Patent Application No. 2008-206089, filed on Aug. 8, 2008, the entire contents of which are incorporated herein by reference.

FIELD

The embodiments discussed herein are related to a piezoelectric thin-film resonator, and a filter, a duplexer duplexer, or a communications device using the same.

BACKGROUND

With a rapid proliferation of wireless devices typified by mobile phones, there has been an increasing demand for compact and high-performance filters or duplexers. The filter or the duplexer is configured by combining resonators. Hitherto, surface acoustic waves (SAWs) have been mainly used for the resonator. Recently, however, piezoelectric thin-film resonators, which are low in loss and improved in electric power resistance, electro-static destruction (ESD) property, etc., are being increasingly used.

The piezoelectric thin-film resonators are categorized into a film bulk acoustic resonator (FBAR) type and a solidly mounted resonator (SMR) type. The FBAR has a configuration wherein, as main components, an upper electrode, a piezoelectric film, and a lower electrode are arranged on a substrate, and a cavity is provided below the lower electrode in a region where the upper electrode and the lower electrode oppose each other. The cavities are classified, for example, into the following three kinds from the view point of configuration. The first is a cavity formed into a shape penetrating from the surface of the substrate to the back surface thereof. The second is a cavity formed into a shape having a depression in the surface of substrate. The third is a cavity arranged in air bridge manner on the substrate surface.

The SMR has a structure wherein, instead of using the above-described cavity, films having a high acoustic impedance and films having a low acoustic impedance are alternately laminated into a laminate film that has a thickness of $\lambda/4$ ($\lambda$: a wavelength of an acoustic wave) and that is utilized as an acoustic reflecting film.

In the FBAR or the SMR, upon applying a high-frequency electric signal between the upper electrode and the lower electrode, an acoustic wave is excited under an inverse piezoelectric effect, in a region (membrane region) wherein the upper electrode and the lower electrode oppose each other with the piezoelectric film therebetween. On the other hand, under a piezoelectric effect, a distortion due to the acoustic wave is converted into an electric signal. The acoustic wave is reflected on side end faces of each of the upper electrode and the lower electrode, thereby constituting thickness extensional vibration waves each having a main displacement in the thickness direction. In this structure, resonance occurs at a frequency at which the total film thickness H in the membrane region becomes an integral multiple (n-th multiple) of a ½ wavelength of the acoustic wave. Letting the propagation speed of an acoustic wave, determined by a material be V, the resonant frequency F is given by $F=nV/2H$. By taking advantage of this resonance phenomenon to control the resonant frequency by the film thickness, it is possible to produce a piezoelectric thin-film resonator having a desired frequency characteristic.

As a conventional art that has achieved an enhancement of the Q value of the piezoelectric thin-film resonator, especially of the anti-resonance Q value thereof, there has been known equipment wherein the outer peripheral portion of a piezoelectric film is disposed on the inner side further than the outer periphery of the region where the lower electrode and the upper electrode oppose each other (refer to, for example, Japanese Laid-open Patent Publication No. 2007-300430). With this arrangement, lateral leakage of acoustic waves is suppressed, leading to an enhancement of the anti-resonance Q value.

SUMMARY

According to an aspect of the invention, a piezoelectric thin film resonator includes a substrate, a lower electrode formed on the substrate, a piezoelectric film formed on the lower electrode, and an upper electrode formed on the piezoelectric film, the lower electrode and the upper electrode opposing each other through the piezoelectric film to form an opposing region, the opposing region including a space at a boundary of the opposing region. The space extends from an inner side to an outer side of the opposing region and is formed in or on the piezoelectric film.

According to another aspect of the invention, a filter, a duplexer or a transmission device includes the piezoelectric thin film resonator.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIG. 1A is a plan view of an example of a piezoelectric thin film resonator according to a first embodiment and FIG. 1B is a sectional view taken along a line A-A in FIG. 1A;

FIG. 10A is a plan view of a configuration of a piezoelectric thin film resonator according to a third embodiment and FIG. 10B is a sectional view taken along a line B-B in FIG. 10A;

DESCRIPTION OF EMBODIMENTS

Figure 2A:
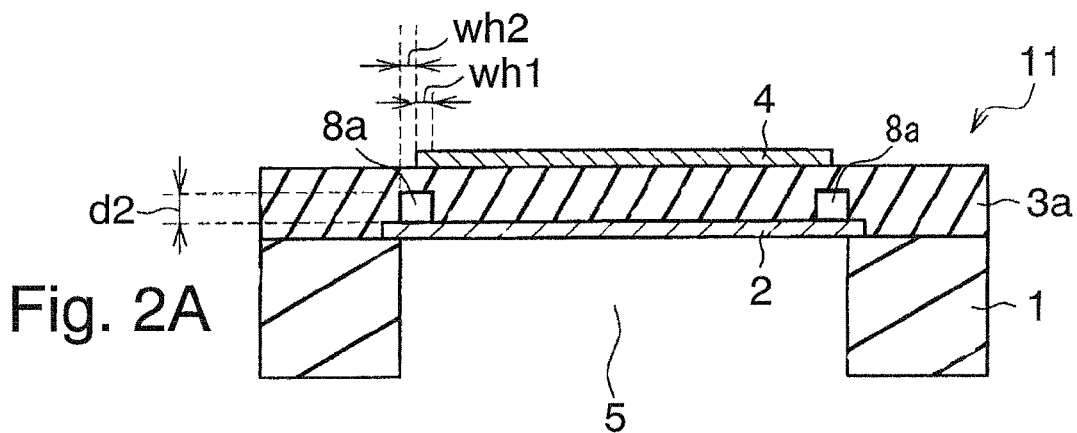
FIG. 2A is a sectional view of illustrating a piezoelectric thin film resonator according to a modification of the first embodiment and FIG. 2B is a sectional view of illustrating a piezoelectric thin film resonator according to another modification of the first embodiment.

In an embodiment according to the present invention, the space may be formed by removing one portion of the piezoelectric film. In this case, since merely one portion along the film-thickness direction is removed, lateral leakage of acoustic waves may be inhibited without the mechanical strength of the membrane being impaired.

In an embodiment according to the present invention, the space may be configured by removing the top surface portion or the bottom surface portion of the piezoelectric film from the inner side of the opposing region toward the outer side thereof, so as to straddle the upper electrode's edge constituting the boundary portion between the opposing region where the upper electrode and the lower electrode oppose each other, and the outside. With this arrangement, the space may be formed after the piezoelectric film has been formed.

In an embodiment according to the present invention, the space can be configured by removing the top surface portion or the bottom surface portion of the piezoelectric film from the inner side of the opposing region toward the outer side thereof, so as to straddle the lower electrode's edge constituting the boundary portion between an opposing region where the upper electrode and the lower electrode oppose each other, and the outside.

In an embodiment according to the present invention, the space may be provided between the top surface of the piezoelectric film and the upper electrode, or between the piezoelectric film and the lower electrode. In this configuration, since the piezoelectric film is not removed at all, there is no possibility that the mechanical strength of the membrane may be impaired.

In an embodiment according to the present invention, an insulator having a different acoustic characteristic from that of the piezoelectric film may be provided instead of the space. This insulator allows the mechanical strength of the membrane to be maintained.

In another aspect, a piezoelectric thin-film resonator according to the present invention includes a substrate; a lower electrode provided on the substrate; a piezoelectric film provided on the lower electrode; an upper electrode provided on the piezoelectric film; and an insulator having an acoustic characteristic different from that of the piezoelectric film, and formed so as to straddle an boundary portion between an opposing region where the upper electrode and the lower electrode oppose each other and the outside, extending from the inner side of the opposing region toward the outer side thereof, wherein the insulator is configured by penetrating the piezoelectric film.

With this arrangement, lateral leakage of acoustic waves can be suppressed to thereby enhance the anti-resonance Q value. Furthermore, since the insulator is embedded in a portion from which the piezoelectric film has been removed, there is no possibility that the mechanical strength of the membrane may be impaired.

In an embodiment according to the present invention, the insulator may be smaller in acoustic impedance than the piezoelectric film. Thereby, lateral leakage of acoustic waves can be more effectively inhibited.

In an embodiment according to the present invention, the insulator may be silicon oxide. This enables lateral leakage of acoustic waves to be further effectively suppressed.

In still another aspect, a piezoelectric thin-film resonator according to of the present invention includes a substrate; a lower electrode provided on the substrate; a piezoelectric film provided on the lower electrode; an upper electrode provided on the piezoelectric film; and a space formed so as to straddle the lower electrode's edge constituting an boundary portion between an opposing region where the upper electrode and the lower electrode oppose each other and the outside, penetrating the piezoelectric film from the inner side of the opposing region toward the outer side thereof, wherein the upper electrode opposing the edge of the lower electrode is configured to extend to the outside of the opposing region.

With this arrangement, it is possible to suppress lateral leakage of acoustic waves and achieve enhancement of the anti-resonance Q value. Moreover, the upper electrode opposing the edge of the lower electrode is configured to extend to the outside of the opposing region, so that, in the region where the space is formed, the membrane is held by the upper electrode film. This allows the mechanical strength of the membrane to be maintained.

In an embodiment according to the present invention, a space may be provided below the opposing region, and the space may be formed wider than the opposing region.

If the space is formed narrower than the opposing region, the periphery of the opposing region is fixed to the substrate. In the periphery of the opposing region, fixed to the substrate, a desired thickness extensional vibration is suppressed, so that the anti-resonance Q value decreases. However, as in the above-described configuration, by forming the space wider than the opposing region, the decrease of the Q value can be inhibited.

In an embodiment according to the present invention, the resonant vibration of the above-described piezoelectric thin-film resonator may be in a thickness extensional vibration mode. Using this thickness extensional vibration mode allows more effective inhibition of lateral leakage of acoustic waves, in the structure of the piezoelectric thin-film resonator. This leads to an enhancement of the Q value (especially, the anti-resonance Q value).

A filter, a duplexer, or a communications device including at least one of the above-described piezoelectric thin-film resonator is also one of the present embodiments. By applying the piezoelectric thin-film resonator that has achieved a higher Q value, it is possible to implement a filter, a duplexer, or a communications device that has achieved lower loss.

First Embodiment

[Configuration of Piezoelectric Thin-Film Resonator]

FIG. 1A is a plan view of the configuration of a piezoelectric thin-film resonator (hereinafter, referred to as FBAR) 10 according to a first embodiment, and FIG. 1B is a sectional view of the piezoelectric thin-film resonator taken along a line A-A in FIG. 1A. In the FBAR 10 illustrated in FIGS. 1A and 1B, a Ruthenium (Ru) film as a lower electrode 2 is provided on a substrate 1 made of silicon (Si). The thickness of the lower electrode 2 is 300 nm. As a piezoelectric film 3, an aluminum nitride (AlN) film with a thickness of 1100 nm is provided on the lower electrode 2. An upper electrode 4 is provided on the piezoelectric film 3 so as to have a region in which the upper electrode 4 opposes to the lower electrode 2 through the piezoelectric film 3. The upper electrode 4 is a ruthenium (Ru) film with a thickness of 300 nm.

The shape (shape as viewed from above) of a region T (opposing region) is an ellipse where the lower electrode 2 and the upper electrode 4 oppose each other with the piezoelectric film 3 therebetween. The ellipse is 180 μm in major axis and 150 μm in minor axis. Below the opposing region T, there is provided a cavity 5 having a perimeter larger by 1 μm than that of the opposing region T. That is, the cavity 5 is formed wider than the opposing region T.

With this arrangement, the FBAR having a resonant frequency of about 2 GHz may be obtained. The lower electrode 2, the piezoelectric film 3, and the upper electrode 4 are each formed by, e.g., deposition by a sputtering method, exposure, and wet etching or dry etching.

The upper electrode 4 and the lower electrode 2, besides the foregoing, may be made of a material such as aluminum (Al), copper (Cu), molybdenum (Mo), tungsten (W), tantrum (Ta), platinum (Pt), rhodium (Rh), iridium (Ir) or the like. As a material for the piezoelectric film 3, zinc oxide (ZnO), lead zirconium titanate (PZT), lead titanate ($PbTiO_3$) or the like may be employed besides the above-described Aluminum nitride (AlN). As a material for the substrate, glass or the like may be used besides silicon (Si).

In the FBAR depicted in FIGS. 1A and 1B, a space 8 is formed by removing one portion of the piezoelectric film 3, adjacent to the upper electrode 4 at the edge of the upper electrode 4 defining the opposing region T. On the projection plane of the FBAR 10 in the figure, the space 8 is provided so as to straddle the edge of the upper electrode 4. Here, the depth d1 of the space 8 is 500 nm. This depth d1, 500 nm, is about a half the film thickness 1200 nm of the piezoelectric film 3. In this manner, by providing the space 8 in a portion along the thickness direction of the piezoelectric film 3, it is possible to suppress lateral leakage of acoustic waves while maintaining the mechanical strength of the membrane region of the FBAR 10. This result improves an anti-resonance Q value. A detailed relationship between the depth d1 and the Q value will be given later.

A lateral dimension of the space 8 is a sum of wh1 and wh2. wh1 denotes the width of a portion located below the upper electrode 4 (inner side the opposing region T) and wh2 denotes the width of a portion located outside the upper electrode 4 (outer side of the opposing region T) and wh1 and wh2 are each 1 μm. Hence, the space 8 is formed over the entire width of 2 μm from the inner side of the opposing region T toward the outer side thereof.

After the lower electrode 2, the piezoelectric film 3, and the upper electrode 4 have been formed, the space 8 may be formed either by wet etching with the place except a place where the space 8 is to be formed being masked, or by etching using a dry etching method.

[Modification of Configuration]

Figure 3A:
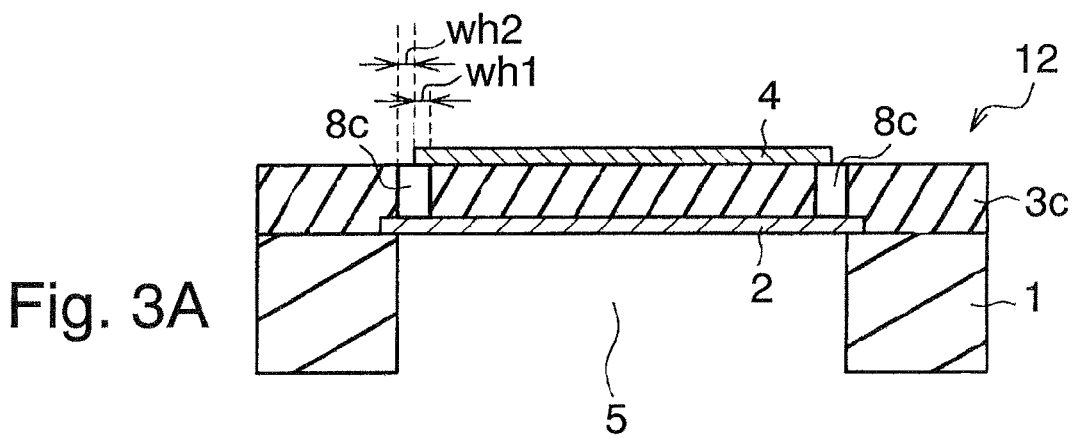
FIGS. 3A and 3B are sectional views of illustrating a piezoelectric thin film resonator for reference.

FIG. 2A is a sectional view depicting the configuration of a FBAR 11 according to a modification of the first embodiment. The surface portion of the piezoelectric film 3a, adjacent to the lower electrode 2 is removed to form a space 8 at the position corresponding to the edge of the upper electrode 4, defining the opposing region T where the lower electrode 2 and the upper electrode 4 oppose each other. On the projection plane of the FBAR 11, the space 8a is provided across the edge of the upper electrode 4 through the piezoelectric film 3a as depicted in FIG. 3A. Here, the depth d2 of the space 8a is 500 nm. The lengths wh1 and wh2 are each 1 μm as in the case of the FBAR 10 illustrated in FIG. 1A.

The space 8a in FIG. 2A may be formed, for example, by forming a sacrifice layer in a region where the space 8a to be formed after having formed the lower electrode 2 and then by removing the sacrifice layer after having formed the piezoelectric film 3a and the upper electrode 4.

Figure 2B:
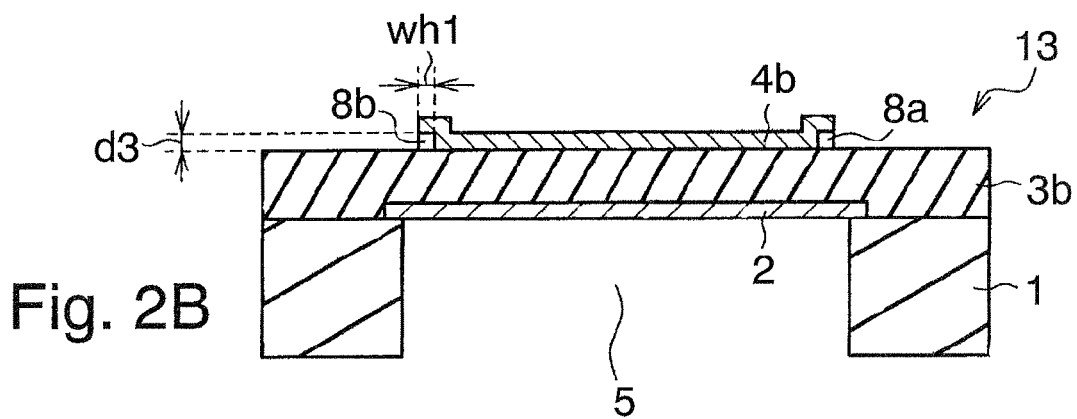
Figure 3B:
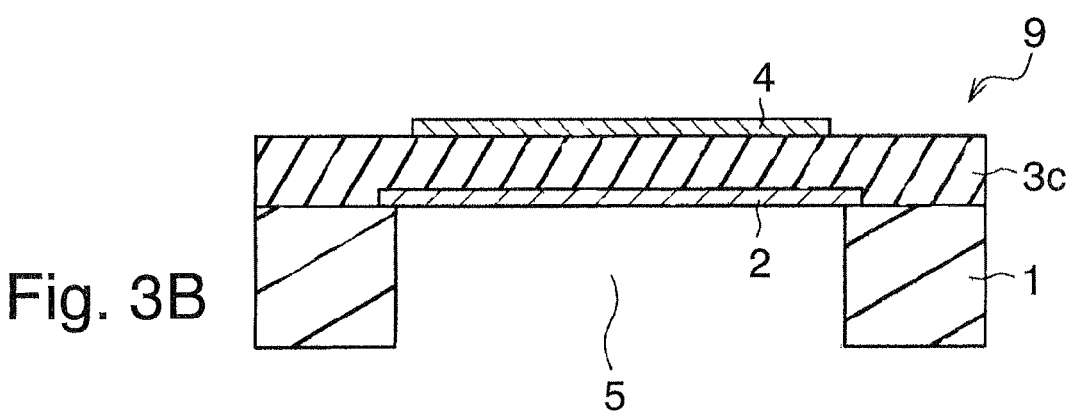

FIG. 2B is a sectional view illustrating the configuration of a FBAR 13 according to another modification of the first embodiment. A space 8b is provided between the upper electrode 4b and the surface of the piezoelectric film 3b at the edge of the upper electrode 4b, defining the opposing region T where the lower electrode 2 and the upper electrode 4b oppose each other as depicted in FIG. 3B. That is, the space 8b is formed by the edge of the upper electrode 4b leaving the surface of the piezoelectric film 3b. Here, the height d3 of the space 8b is 50 nm, and the width wh1 of the space 8b is 1 μm.

The space 8b in FIG. 2B may be formed, for example, by forming a sacrifice layer in a region where the space 8b to be formed after having formed the piezoelectric film 3b, and then by removing the sacrifice layer after having formed the upper electrode 4b. The configuration illustrated in FIG. 2B may have an advantage in ease of manufacturing.

FIG. 3A is a structural example of FBAR illustrated for reference. In an FBAR 12 in FIG. 3A, one portion of the piezoelectric film 3c is removed to form a space 8c so as to penetrate along the film thickness direction at the edge of the upper electrode 4, defining the opposing region T where the lower electrode 2 and the upper electrode 4 oppose each other. On a projection plane of the FBAR 12, the space 8c is provided across the edge of the upper electrode 4.

FIG. 3B is also a structural example of FBAR illustrated for reference. In FBAR 9 in FIG. 3B, no space is provided in the opposing region T where the lower electrode 2 and the upper electrode 4 oppose each other.

[Relationship between Configuration of FBAR and Anti-Resonance Q Value]

Figure 4:
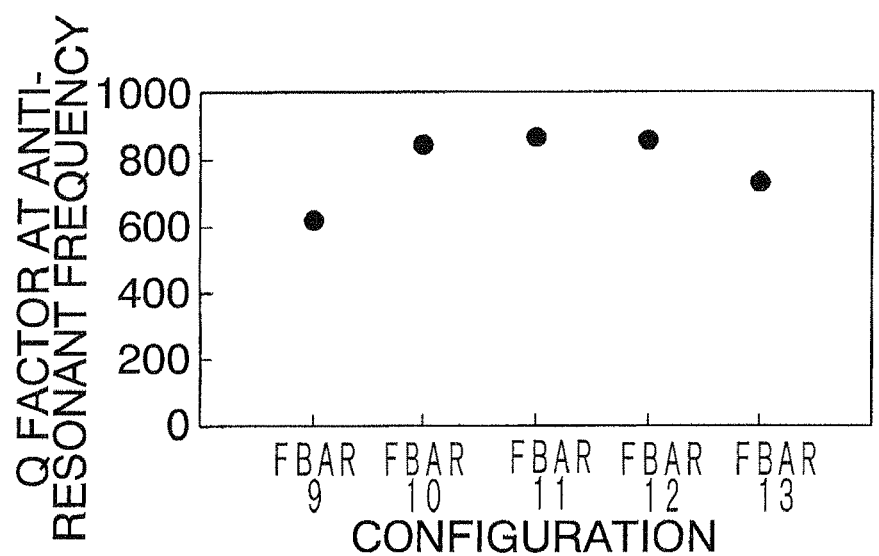
FIG. 4 is a graph illustrating anti-resonance Q values of each of the piezoelectric thin film resonators.

FIG. 4 is a graph illustrating anti-resonance Q values of the above-described five FBARs 9 to 13. Examination of the degree of enhancement of the anti-resonance Q value shows the following results. With respect to the FBAR 9 having no space in the piezoelectric film, the FBAR 13 having a space between the piezoelectric film and the upper electrode exhibits an enhancement by about 120, and the FBARs 10, 11, and 12 each having a space in the piezoelectric film exhibits an enhancement by about 240.

[Relationship between Thickness of Space and Anti-Resonance Q Value]

Figure 5A:
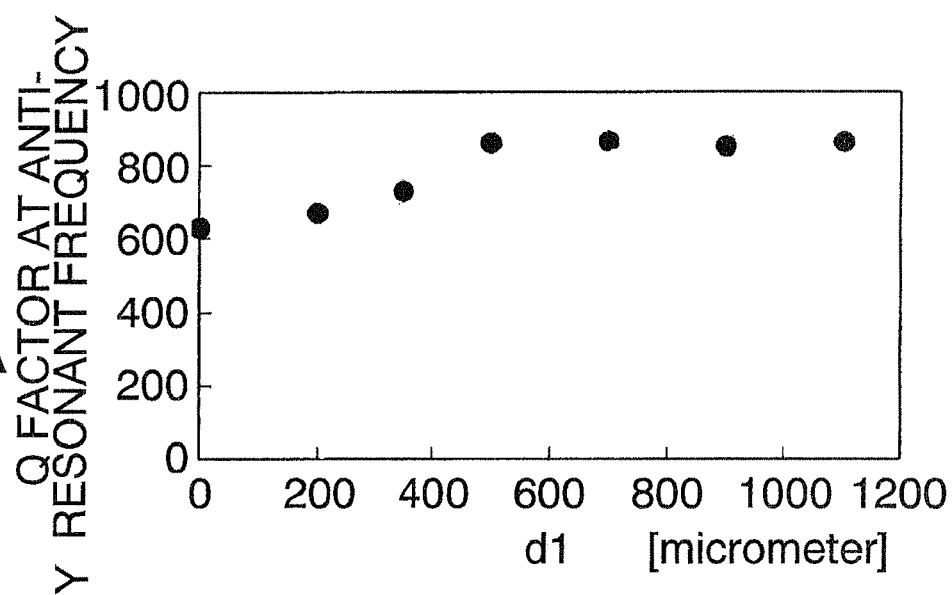
FIG. 5A a graph illustrating variations in the anti-resonance Q value with respect to changes in the depth of the space in the piezoelectric thin film resonator depicted in FIG. 1A
Figure 5B:
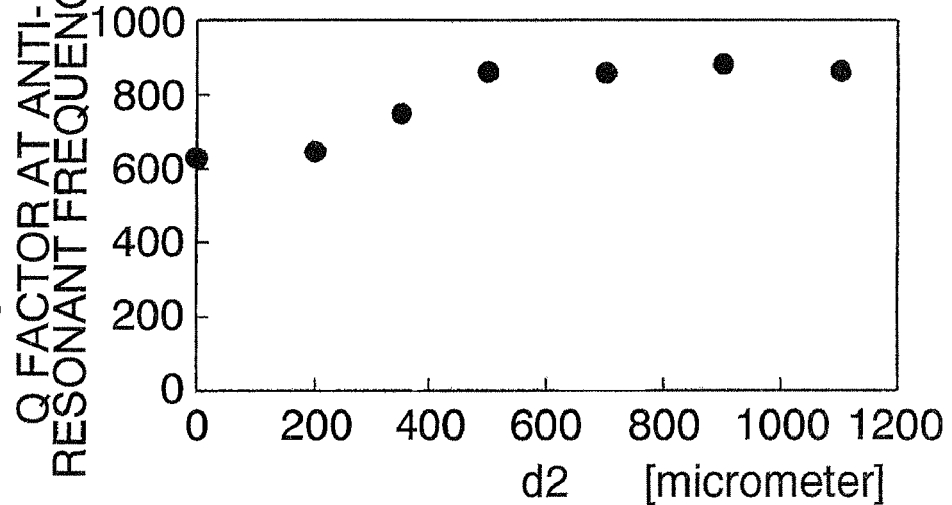
FIG. 5B is a graph illustrating variations in the anti-resonance Q value with respect to changes in the depth of the space in the piezoelectric thin film resonator in FIG. 2A.

FIG. 5A is a graph illustrating variations in the anti-resonance Q value with respect to changes in the depth d1 of the space 8 in the FBAR 10 depicted in FIG. 1A. FIG. 5B is a graph illustrating variations in the anti-resonance Q value with respect to changes in the depth d2 of the space 8a in the FBAR 11 illustrated in FIG. 2A. From the results illustrating in FIGS. 5A and 5B it may be seen that the anti-resonance Q value becomes saturated by making the depth of the space a value about a half or more of the thickness, 1100 nm, of the piezoelectric film. It is therefore desirable that the depth of the space is on the order of one half of the thickness of the piezoelectric film.

[Relationship between Relative Position of Space with Respect to Boundary of Opposing Region T and Anti-Resonance Q Value]

Figure 6:
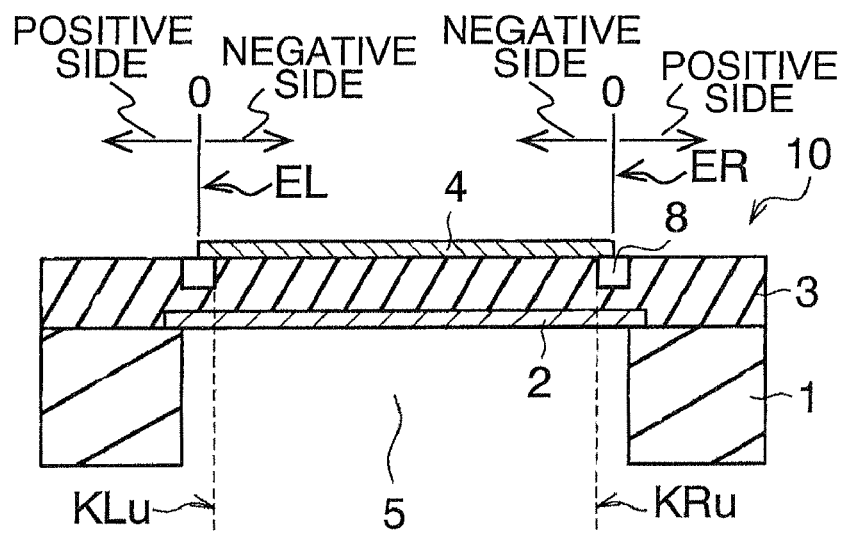
FIG. 6 is a diagram explaining an offset amount of the space in the piezoelectric thin film resonator illustrated in FIGS. 1A and 1B.

FIG. 6 is a diagram explaining an offset amount of the space in FBAR 10 illustrated in FIG. 1A. Regarding the space 8 on the right side, the offset amount is defined relative to an edge position ER of the upper electrode 4 (i.e., boundary between the opposing region T and the outside). Here, it is assumed that the offset amount=0 when an inner wall KRu of the space 8 is located at the edge ER. The inner side of the opposing region T is taken as (−) side or negative side, and its outer side as (+) side or positive. Likewise, regarding the space 8 on the left side, as in the case of the space 8 on the right side, it is assumed that offset amount=0 when an inner wall KLu of the space 8 is located at the edge EL. The inner side of the opposing region T is taken as (−) side or negative side, and the outer side thereof is taken as (+) side or positive. The inner side wall KRu of the space 8 on the right side in the figure and the inner side wall KLu of the space 8 on the left side in the figure are assumed to be moved by the same moving amount in a direction such that the KRu and the KLu constitute a mirror relationship therebetween.

Figure 7:
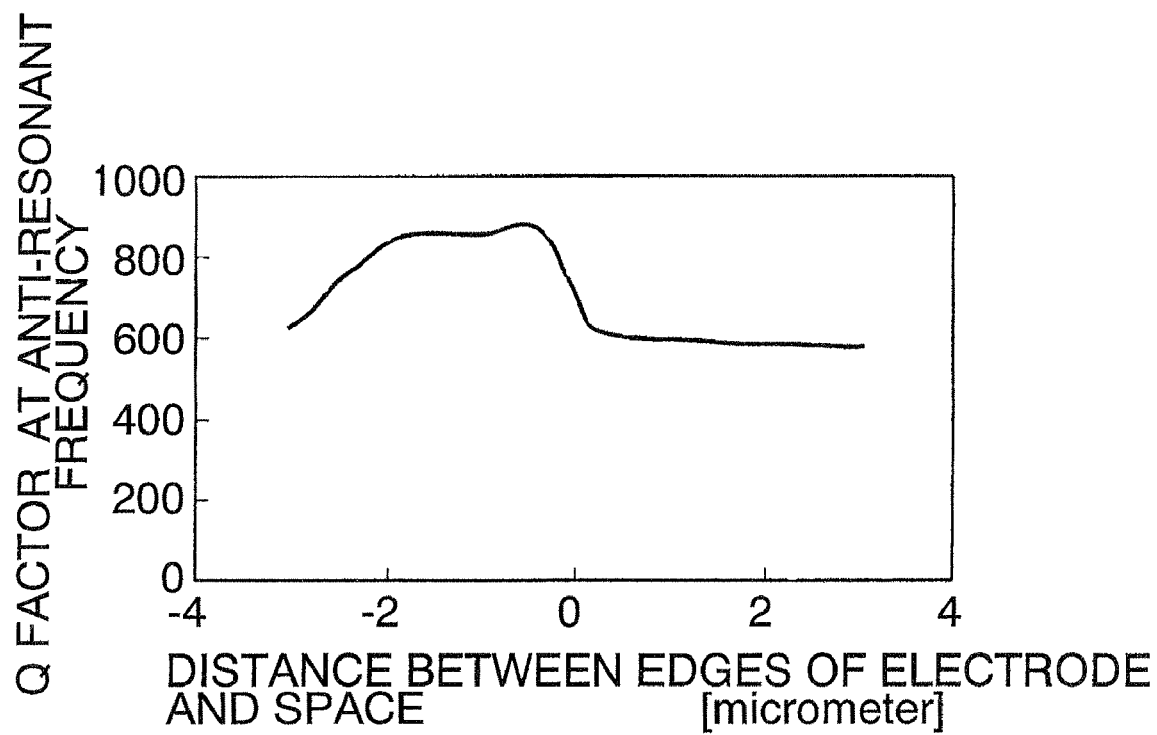
FIG. 7 is a graph illustrating variations in the anti-resonance Q value against the offset amount of the space.

FIG. 7 is a graph illustrating variations in the anti-resonance Q value plotted against the horizontal axis representing the offset amount of the space 8, wherein the position of the inner side wall of the space 8 relative to the edge position of the upper electrode 4 is used as the offset amount as described above. The graph in FIG. 7 shows that the anti-resonance Q value is enhanced when the offset amount is 0 to 2 μm. Hence, it may be said that the anti-resonance Q value is enhanced when, on the projection plane of the FBAR, the space 8 is located at a position such as to straddle the edge of the upper electrode 4, constituting the boundary of the opposing region.

Second Embodiment

Figure 8:
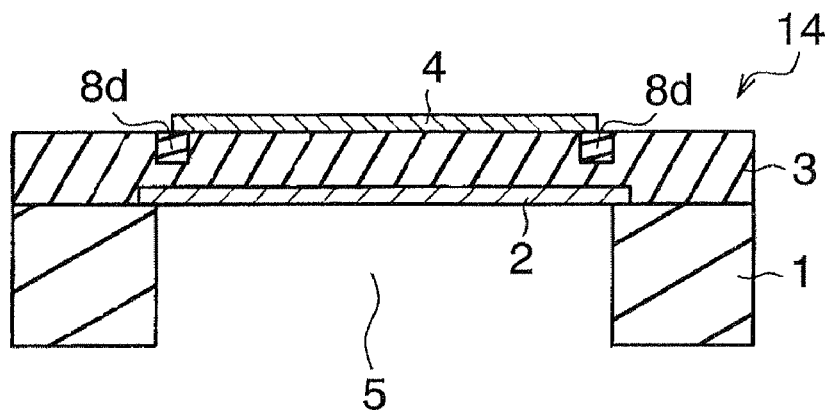
FIG. 8 is a sectional view illustrating a configuration of a piezoelectric thin film resonator according to a second embodiment.

FIG. 8 is a sectional view illustrating the configuration of the FBAR 14 according to a second embodiment. The FBAR 14 is configured by replacing the space 8 of the FBAR 10 illustrated in FIG. 1A with an insulator 8d. The acoustic impedance of the insulator 8d is different from that of the piezoelectric film 3. The acoustic impedance Z is expressed, for example, by the following equation (1).

$$Z=\sqrt{(\rho \times E)} \quad (1)$$

(ρ: density; E: Young's modulus)

Figure 9:
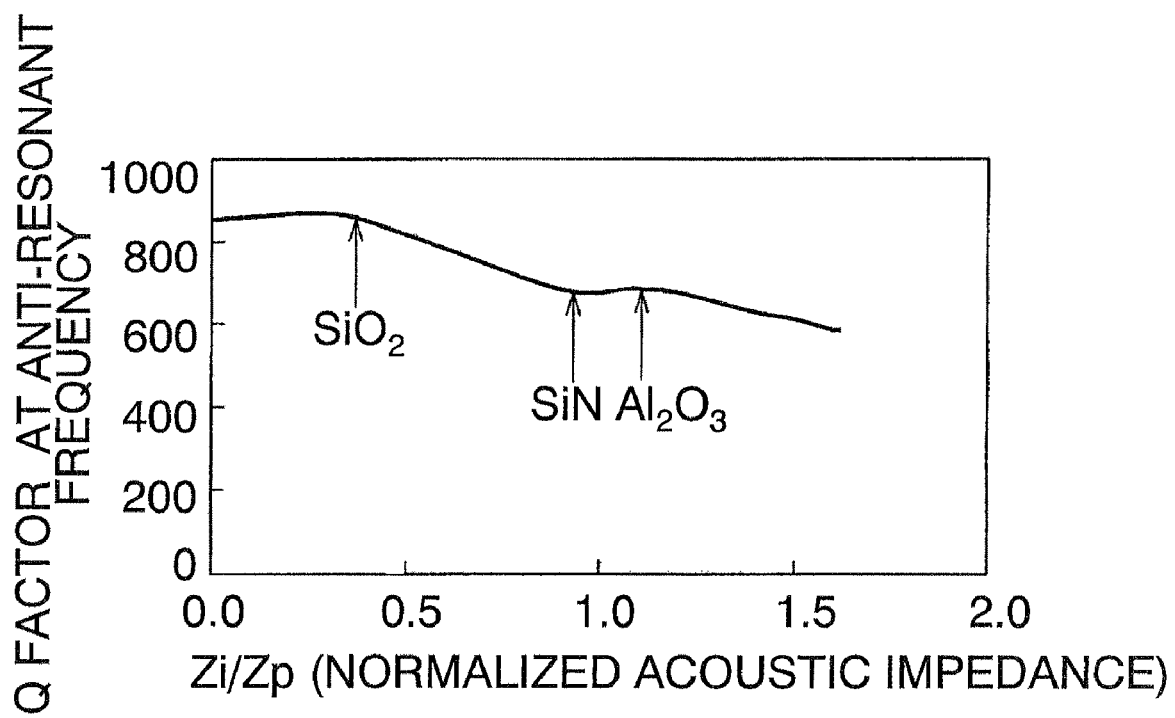
FIG. 9 is a graph illustrating variations in the anti-resonance Q value with respect to changes in the acoustic impedance of the insulator.

FIG. 9 is a graph illustrating variations in the anti-resonance Q value with respect to changes in the acoustic impedance of the insulator 8d. In FIG. 9, Zi denotes the acoustic impedance of the insulator 8d, and Zp denotes the acoustic impedance of the piezoelectric film 3 (AlN). Hence, Zi/Zp denoted by the horizontal axis represents normalized acoustic impedance. In the graph, the anti-resonance Q value in the case where the space 8 without an insulator is used is plotted with Zi/Zp as 0. The graph illustrated in FIG. 9 depicts that a smaller Zi/Zp, that is, a smaller acoustic impedance of the insulator, enhances the anti-resonance Q value. As a useful insulator material having a low acoustic impedance, for example, silicon oxide ($SiO_2$) is employed. Using the silicon oxide provides an anti-resonance Q value substantially equal to that in the case where the space 8 without an insulator is used. From the foregoing, it may be said, in a broad sense, that the anti-resonance Q value is enhanced when Zi/Zp is smaller than one or the acoustic impedance of the insulator 8d is smaller than that of the piezoelectric film 3.

The other FBARs 11 and 13 in the above-described first embodiment may also be configured by replacing the respective spaces 8a and 8b with the spaces with insulators. In this way, replacing the spaces with the spaces filled with insulators makes the mechanical strengths of the membrane regions less prone to be impaired.

Third Embodiment

FIG. 10A illustrates a plan view of the configuration of an FBAR 15 according to a third embodiment, and FIG. 10B illustrates a sectional view taken away along a line B-B in FIG. 10A. In the FBAR 10 (see FIG. 1A) in the above-described first embodiment, the space 8 has been formed along the entire peripheral edge of the opposing region T when viewed from above. In contrast, in the FBAR 15 illustrated in FIG. 10A, a space 8e is formed along one portion of the peripheral edge of the opposing region T. In the FBAR 15, when viewed from above, the space 8e is formed in a portion where the edge of the upper electrode 4e defines a boundary between the opposing region T and the outside. The space 8e is configured by removing the surface portion of a piezoelectric film 3e, adjacent to the upper electrode 4e. In the FBAR 15, wh1 and wh2 are each 1 μm as in the case of the FBAR 10. In this manner, also by providing a space in one portion of the boundary between the opposing region T and the outside, lateral leakage of acoustic waves may be inhibited.

As illustrated in the plan view in FIG. 10A, the space 8e is formed over the entirety of a region where the lower electrode 2e is provided to extend to the outside of the opposing region T (wraparound region of the lower electrode 2e). As a consequence, characteristic improving effect is enhanced as compared with the case where the space 8e is provided in one portion of the wraparound region of the lower electrode lower electrode 2e.

Fourth Embodiment

Figures 11A, 11B:
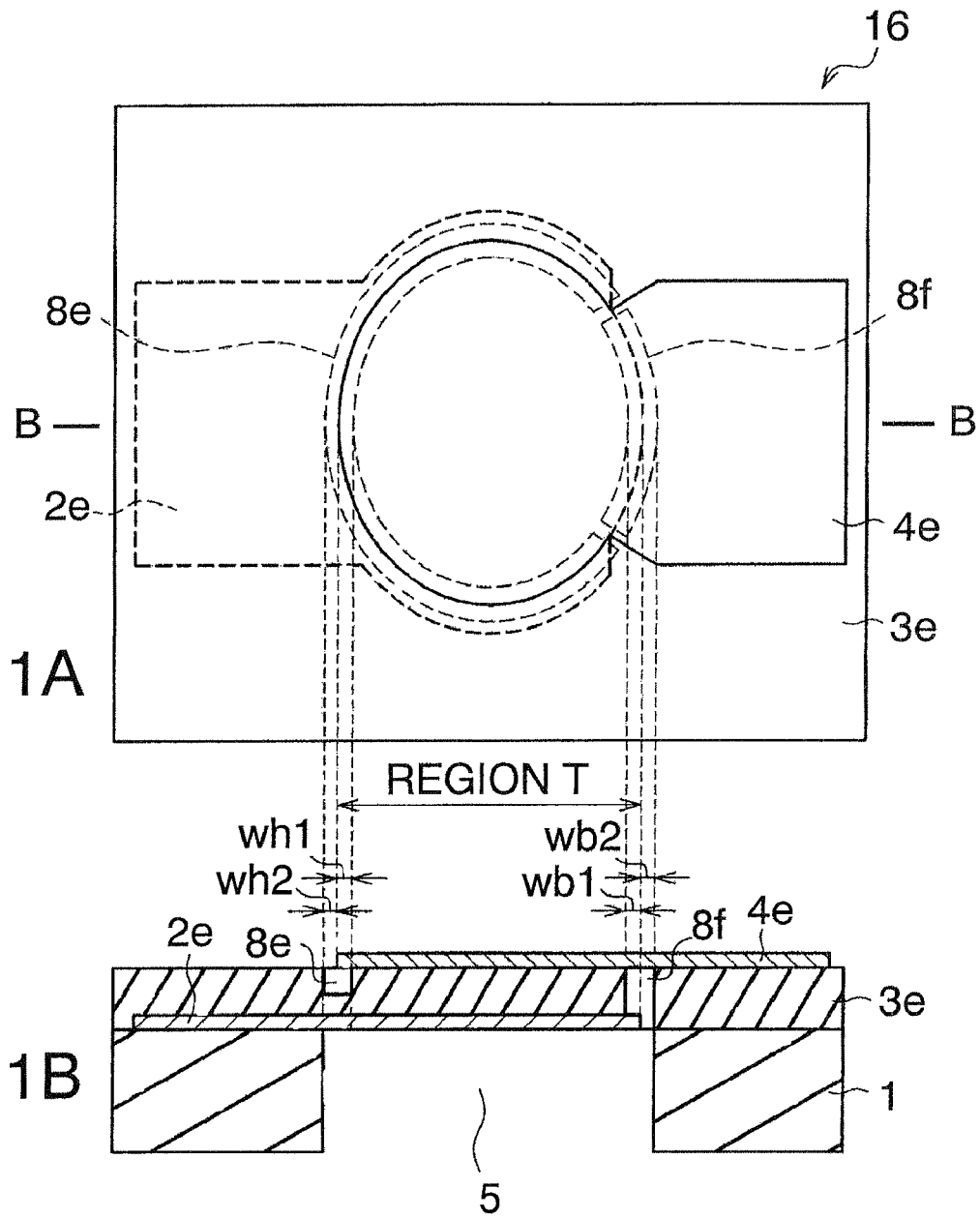
FIG. 11A is a plan view of a configuration of a piezoelectric thin film resonator according to a fourth embodiment and FIG. 11B is a cross sectional view taken along a line B-B in FIG. 11A.

FIG. 11A illustrates a plan view of the configuration of an FBAR 16 according to a fourth embodiment, and FIG. 11B illustrates a cross sectional view taken away along a line B-B in FIG. 11A. In the FBAR 16, in addition to the configuration of the FBAR 15, a space 8f is formed in a portion where the edge of the lower electrode 2e defines a boundary between the opposing region T and the outside. The space 8f in the FBAR 16 is configured so that one portion of a piezoelectric film 3e is removed to penetrate along the film thickness direction at the edge of the lower electrode lower electrode 2e, defining the opposing region T where the lower electrode 2e and the upper electrode 4e oppose each other. On the projection plane of the FBAR 16, the space 8f is provided so as to straddle the edge of the lower electrode 2e. In the FBAR 16, the width wb1 on the inner side of the opposing region T in the space 8f and the wb2 on the outer side thereof are each 1 μm. Hence, the entire width of the space 8f is 2 μm.

On the place where the space 8f is provided, the upper electrode 4e is formed to extend to the outside of the opposing region T. As a result, in the portion (space 8f) from which the piezoelectric film 3e has been removed, the upper electrode 4e holds the membrane. While not illustrated, a protective film may be further provided over the upper electrode 4e. In this case, the mechanical strength of the membrane becomes larger than that of the configuration holding the membrane by the lower electrode 2e alone.

Figure 12A:
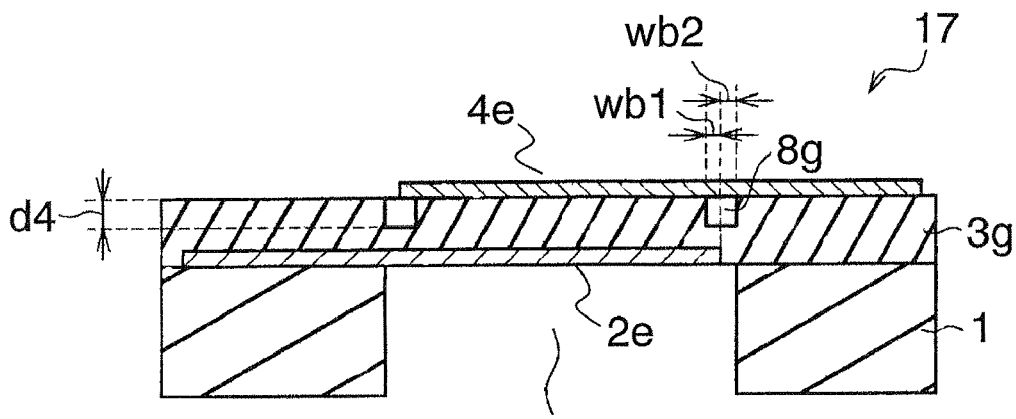
FIG. 12A is a sectional view illustrating a configuration of a piezoelectric thin film resonator according to a modification of the fourth embodiment and FIG. 12B is a sectional view illustrating a configuration of a piezoelectric thin film resonator according to another modification of the fourth embodiment.

FIG. 12A is a sectional view illustrating the configuration of an FBAR 17 according to a modification of the present embodiment. In the FBAR 17, one portion of the piezoelectric film 3g, adjacent to the upper electrode 4e, is removed to form a space 8g at an edge of the lower electrode 2e, defining the opposing region T where the lower electrode 2e and the upper electrode 4e oppose each other. On the projection plane of the FBAR 17, the space 8g is provided so as to straddle the edge of the lower electrode 2e. The depth d4 of the space 8g is 500 nm.

Figure 12B:
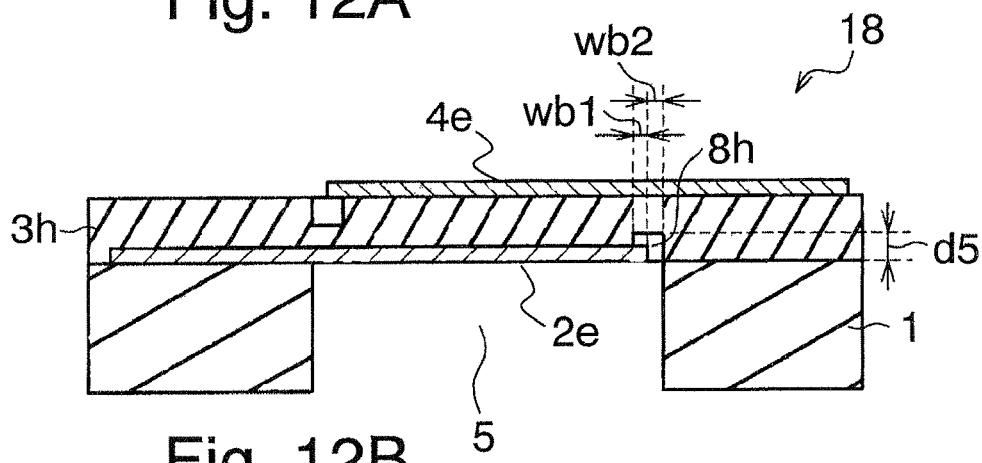

FIG. 12B is a sectional view illustrating the configuration of an FBAR 18 according to another modification of the present embodiment. In the FBAR 18, one portion of the piezoelectric film 3h, adjacent to the lower electrode 2e, is removed to form a space 8h at an edge of the lower electrode 2e, defining the opposing region T where the lower electrode 2e and the upper electrode 4e oppose each other. On a projection plane of the FBAR 17, the space 8h is provided so as to straddle the edge of the lower electrode 2e. The depth d5 of the space 8h is 500 nm.

Figure 13:
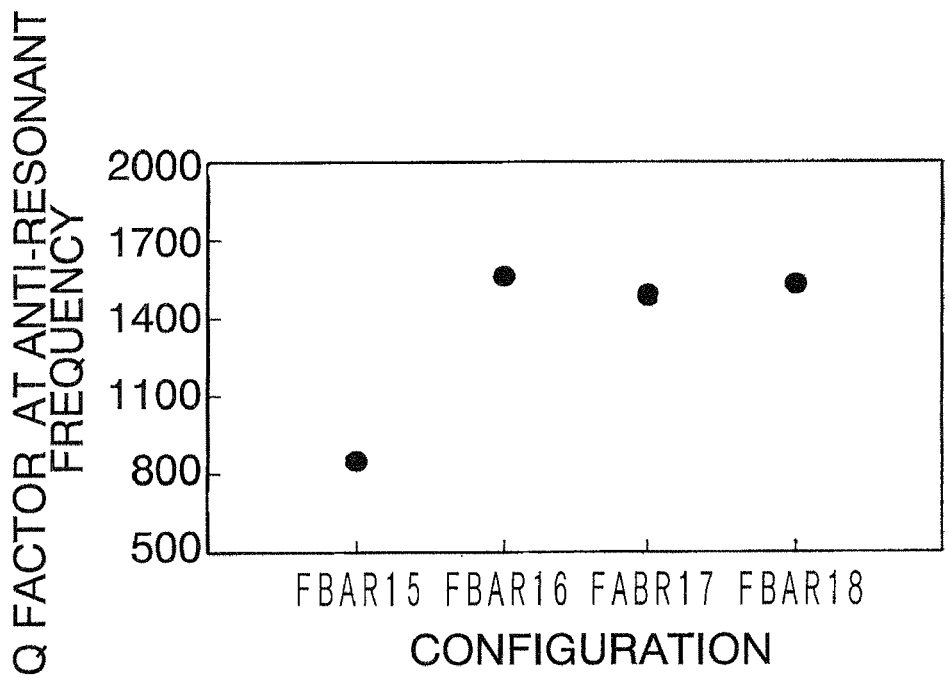
FIG. 13 is a graph illustrating anti-resonance Q values of four piezoelectric thin film resonators.

FIG. 13 is a graph illustrating anti-resonance Q values of the above-described four FBARs 15 to 18. Examination of the degree of enhancement of the anti-resonance Q value is the following results. With respect to the FBAR 15, the FBARs 16 to 18 exhibits enhancements of the anti-resonance Q value by about 650 to 700. The FBARs 16 to 18 each have a configuration such that a space is formed so as to straddle the edge of the lower electrode lower electrode 2e, forming the boundary of the opposing region T Hence, it may be said that the anti-resonance Q value is enhanced by providing the space so as to straddle the edge of the lower electrode 2e.

[Relationship between Opposing Region and Cavity]

Figure 14:
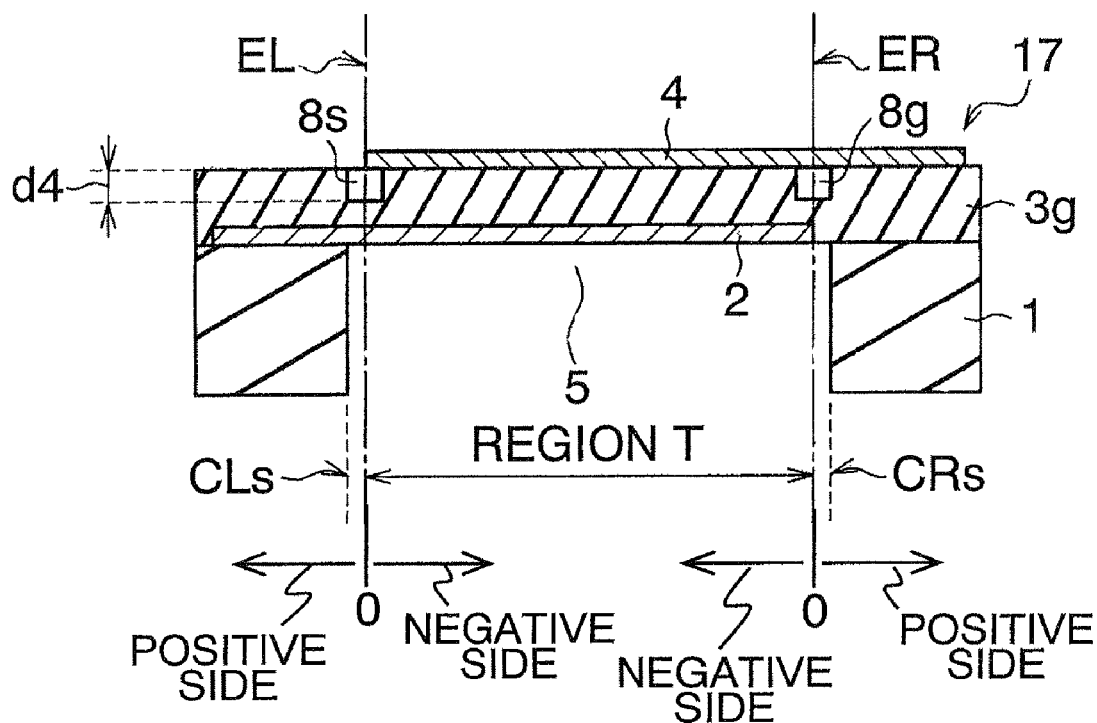
FIG. 14 is a diagram explaining the relationship between an opposing region T and a cavity.

FIG. 14 is a diagram explaining the relationship between the opposing region T and the cavity. An FBAR 17 illustrated in FIG. 14 is of the identical structure as the FBAR 17 illustrated in FIG. 12A. Here, description is made of the effect on the anti-resonance Q value of the size of a cavity 5 formed below the opposing region T where the lower electrode 2e and the upper electrode 4e oppose each other with the piezoelectric film 3g therebetween. On the left side in FIG. 14, it is assumed that the offset amount=0 when a position CLs of the left side wall of the cavity 5 coincides with the edge ER of the upper electrode 4e, defining the boundary between opposing region T and the outside. The inner side of the opposing region T is taken as (−) side or negative side, and its outer side as (+) side or positive. Likewise, on the right side in FIG. 14, it is assumed that the offset amount=0 when a position CRs of the right side wall of the cavity 5 coincides with the edge ER of the lower electrode 2e, defining the boundary between opposing region T and the outside. The inner side of the opposing region T is taken as (−) side or negative side, and its outer side as (+) side or positive. The position CRs of the right side wall of the cavity and the position CLs of left side thereof are assumed to be moved by the same moving amount in a direction such that the CRs and the CLs constitute a mirror relationship therebetween.

Figure 15:
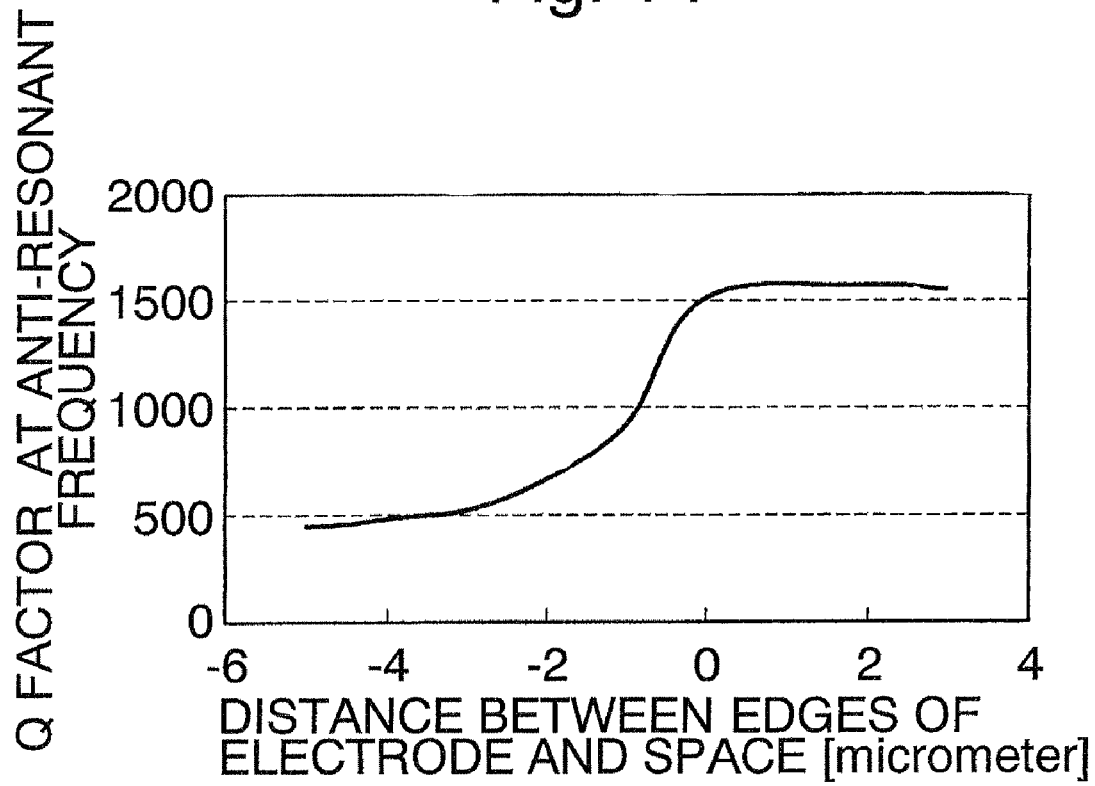
FIG. 15 is a graph illustrating variations in the anti-resonance Q value and an offset amount of the cavity.

FIG. 15 is a graph illustrating variations in the anti-resonance Q value plotted against the horizontal axis representing the offset amount of the cavity 5, wherein the positions of the out side walls of the cavity 5 relative to the edge positions of the upper electrode 4e and the lower electrode lower electrode 2e are each used as the offset amount as described above. From the graph, it may be seen that the anti-resonance Q value decreases when the offset amount is lower than 0 μm. This indicates that making the cavity 5 wider than the opposing region T allows preventing the anti-resonance Q value from decreasing. Also in the first to third embodiments, making the cavity 5 wider than the opposing region T enables an achievement of similar effects.

Fifth Embodiment

Figure 16:
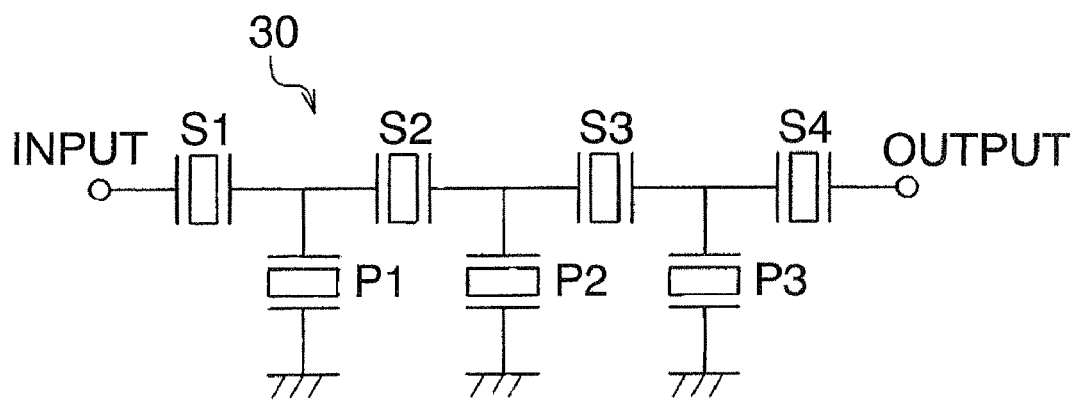
FIG. 16 is a schematic diagram of an equivalent circuit of a filter according to the fifth embodiment.

A fifth embodiment according to the present invention refers to a filter and a duplexer using some of the FBARs according to the first to fourth embodiments. FIG. 16 is an equivalent circuit view of a filter 30 according to the fifth embodiment. A band pass filter having a predetermined pass band is obtained by arranging resonators in series arm and parallel arms through a ladder type connection. This type of filter is generally referred to as a ladder type filter.

The filter 30 illustrated in FIG. 16 includes series resonators S1 to S4 connected to a series arm between an input terminal In and an output terminal Out, and parallel resonators P1 to P3 connected between the line between the input terminal In and the output terminal Out, and the ground (connection to parallel arms). These series resonators S1 to S4, and parallel resonators P1 to P3 each has some of the configurations of the FBARs 10, 11, and 13 to 18 according to the above-described first to fourth embodiments.

Figure 17:
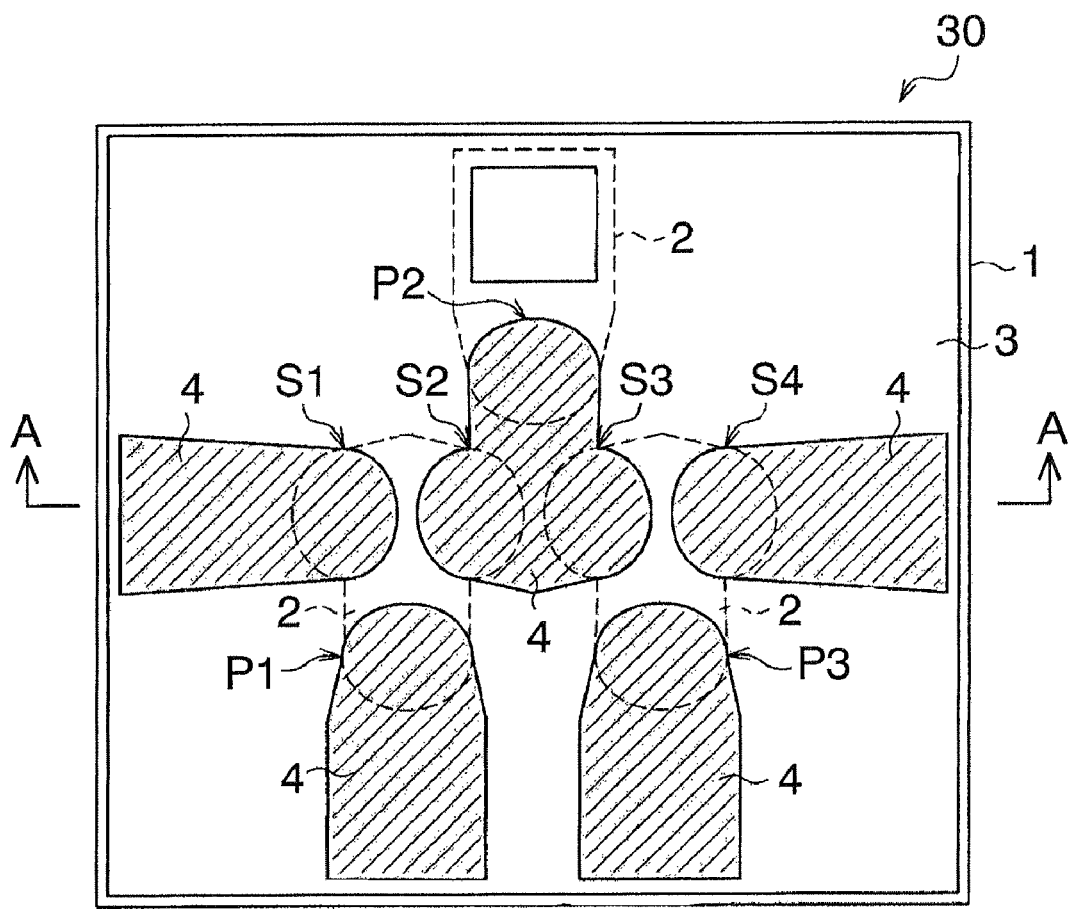
FIG. 17 is a plan view illustrating a configuration of the filter illustrated in FIG. 16.
Figure 18:
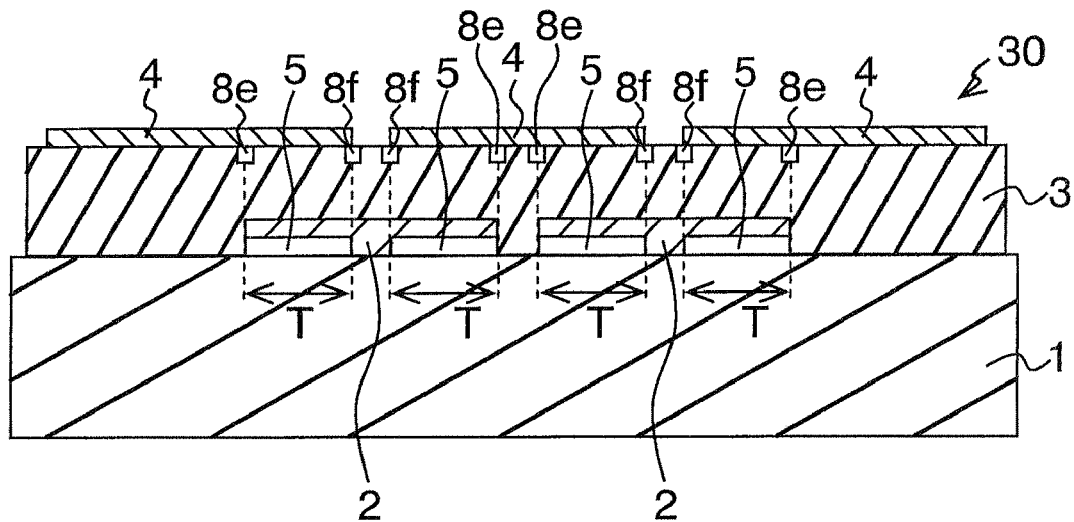
FIG. 18 is a sectional view taken away along a line A-A in FIG. 17.

FIG. 17 is a plan view illustrating the configuration of the filter 30 illustrated in FIG. 16. FIG. 18 is a sectional view taken away along a line A-A in FIG. 17. The series resonators S1 to S4 and the parallel resonators P1 to P3 are formed into an opposing region T where the upper electrode 4 and the lower electrode 2 oppose each other with the piezoelectric film 3 therebetween. These seven resonators are formed on an air bridge typed cavity 5. While not illustrated, regarding the parallel resonators P1 to P3 connected to the parallel arms, a titan (Ti) film with a thickness of 110 is provided over the ruthenium (Ru) film with a thickness of 300 nm, of the upper electrode.

The series resonators S1 to S4 and the parallel resonators P1 to P3 may have a similar configuration, for example, to that of the FBAR 17 illustrated in FIG. 12A. As illustrated in FIG. 18, in the series resonators S1 to S4, spaces 8f are each formed so as to straddle the edge of the upper electrode 4, constituting the boundary of the opposing region T. Furthermore, spaces 8e are each formed so as to straddle the edge of the lower electrode 2, constituting the boundary of the opposing region T This enables an improvement in filter characteristic while maintaining the mechanical strength of the membrane.

Figure 19:
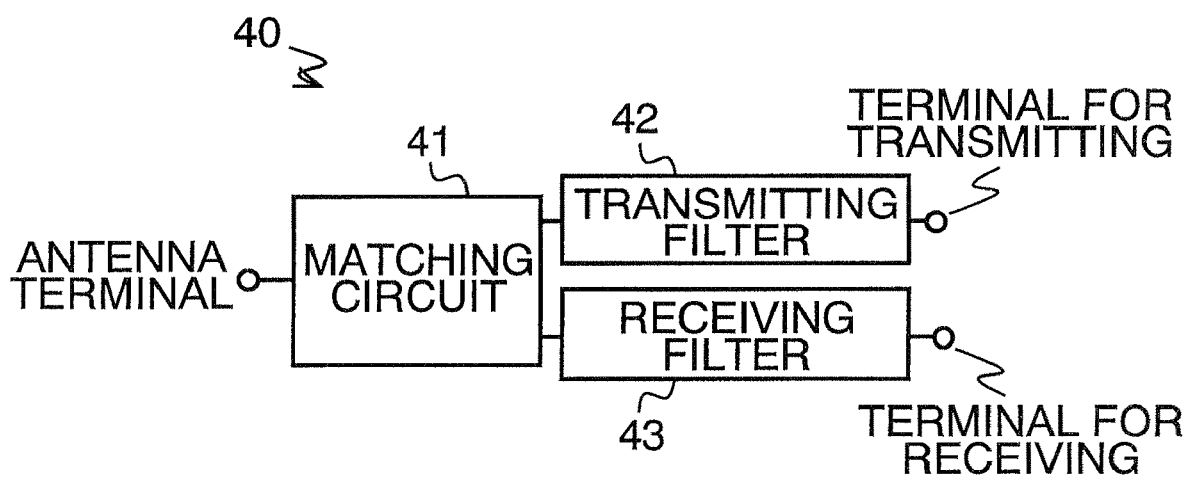
FIG. 19 is a diagram illustrating a configuration of a duplexer.

A duplexer wherein two such band pass filters are connected in parallel is also one of the present embodiments. FIG. 19 is a schematic view illustrating the configuration of a duplexer 40. In the duplexer 40 in FIG. 19, a transmission filter 42 is arranged between an antenna terminal and a transmission terminal, and a reception filter 43 is arranged between the antenna terminal and a reception terminal. Between the antenna terminal and the filters, a matching circuit (e.g., phase shifter) 41 may be added as required in order to adjust impedance. The duplexer 40 plays a role in separating a transmission signal from a reception signal. For example, the duplexer 40 is used immediately below an antenna of a CDMA system mobile phone.

Such filters or duplexer is required to have lower loss, from the viewpoint of ensuring lower power consumption when they are used for a transmission system, as well as from the viewpoint of an improvement in reception sensitivity when they are used in a reception system. Achievement of lower loss in the filters or the duplexer may be realized by configuring the filters or the duplexer through the use of some of the FBARs 10, 11, and 13 to 18 that have achieved higher Q values, according to the above-described embodiments. Moreover, a communications device including such filters or a duplexer is also one of the embodiments according to the present invention.

As described above, in the above-described embodiments, at the edge of the lower electrode or the upper electrode, there is provided the region where the cavity or the insulator is embedded so as to straddle the edge. With this arrangement, the FBARs with higher Q values may be implemented. Application of some of these FBARs to filters or a duplexer allows an achievement of lower loss.

While the present invention has been described in detail as related to the above embodiments, it is to be understood that the present invention is not limited to these specific embodiments, but various modifications and changes may be made within the present inventive concepts that are set forth by the appended claims.

For example, the material for each of the substrate, electrode film, and the piezoelectric film is not limited to that used in the above-described embodiments, but other materials may be used.

The film configurations in the above-described embodiments have been explained only concerning main components of the FBAR. However, for example, a dielectric film may be further provided under the lower electrode or over the upper electrode. The dielectric film under the lower electrode would be able to play, for example, a role as a reinforcement material or a stop layer in etching. On the other hand, the dielectric film over the upper electrode would be able to play, for example, a role as a passivation film or for frequency adjustment.

The cavity in the above-described embodiments has been explained on the case where it is shaped into a hole penetrating the substrate, but the configuration of the cavity is not restricted to this case. For example, the cavity may be configured to have a depression in the surface of the substrate, or may be provided in an air bridge manner on the substrate surface. On the other hand, instead of using the cavity, an acoustic reflecting film may be used to thereby constitute a SMR type piezoelectric thin-film resonator.

The opposing region where the lower electrode and the upper electrode oppose each other with the piezoelectric film therebetween, in the above-described embodiments, has been explained to have a elliptic shape, but its shape is not limited to the ellipse. For example, the shape of the opposing region may be a non-square shape or other shapes.

The case wherein the end faces of the tip portions of the lower electrode, the upper electrode, or the piezoelectric film in the above-described embodiments each forms a right angle with the substrate has been exclusively illustrated, but the shape of the tip portions of the these films are not restricted to this shape. For example, the tip portions of the films may each have a tapered shape.

The case wherein the cavity formed at the edge of the lower electrode or the upper electrode in the above-described embodiments each has a rectangular shape has been exclusively illustrated, but the cavity may have other shapes. The case wherein the width of the cavity is 2 μm has been exemplified, but toward the direction leaving the opposing region, the width may be enlarged. Also, the case wherein the depth of the cavity is 500 nm has been illustrated as an example, but the depth of the cavity is not limited to this value. The depth of the cavity may have other different values.

Even if the example wherein the insulator is provided in the portion from which the piezoelectric film has been removed is applied to any of the piezoelectric thin-film resonators in the present invention set forth in the claims, it is possible to obtain substantially the same characteristics as those in the case where the cavity is used.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A piezoelectric thin film resonator comprising:
   a substrate;
   a lower electrode formed on the substrate;
   a piezoelectric film formed on the lower electrode; and
   an upper electrode formed on the piezoelectric film, the lower electrode and the upper electrode opposing each other through the piezoelectric film to form an opposing region, the opposing region including a space at a boundary of the opposing region, wherein the space extending from an inner side to an outer side of the opposing region is formed in or on the piezoelectric film, and
   the space is formed by removing a part of the piezoelectric film including removing the part of an upper surface or a lower surface of the piezoelectric film to straddle an edge of the upper electrode.

2. The piezoelectric thin film resonator according to claim 1, wherein a cavity is formed under the opposing region and an area of the cavity opposing to the opposing region is larger than an area of the opposing region opposing to the cavity.

3. The piezoelectric thin film resonator according to claim 1, wherein the piezoelectric thin film resonator resonates in a thickness extensional mode.

4. A filter configured to include at least one piezoelectric thin film resonator according to claim 1.

5. A duplexer configured to include at least one piezoelectric thin film resonator according to claim 1.

6. A transmission device configured to include at least one piezoelectric thin film resonator according to claim 1.

7. A piezoelectric thin film resonator comprising:
   a substrate;
   a lower electrode formed on the substrate;
   a piezoelectric film formed on the lower electrode; and
   an upper electrode formed on the piezoelectric film, the lower electrode and the upper electrode opposing each other through the piezoelectric film to form an opposing region, the opposing region including a space at a boundary of the opposing region, wherein the space extending from an inner side to an outer side of the opposing region is formed in or on the piezoelectric film, and
   the space is formed by removing a part of the piezoelectric film including removing the part of an upper surface or a lower surface of the piezoelectric film to straddle an edge of the lower electrode.

8. A piezoelectric thin film resonator comprising:
a substrate;
a lower electrode formed on the substrate;
a piezoelectric film formed on the lower electrode; and
an upper electrode formed on the piezoelectric film, the lower electrode and the upper electrode opposing each other through the piezoelectric film to form an opposing region, the opposing region including a space at a boundary of the opposing region, wherein the space extending from an inner side to an outer side of the opposing region is formed in or on the piezoelectric film, and the space is provided between the upper electrode and the upper surface of the piezoelectric film or between the lower electrode and the lower surface of the piezoelectric film.

9. A piezoelectric thin film resonator comprising:
a substrate;
a lower electrode formed on the substrate;
a piezoelectric film formed on the lower electrode; and
an upper electrode formed on the piezoelectric film, the lower electrode and the upper electrode opposing each other through the piezoelectric film to form an opposing region, the opposing region including a space at a boundary of the opposing region, wherein the space extending from an inner side to an outer side of the opposing region is formed in or on the piezoelectric film, and
the space is filled with an insulating material.

10. A piezoelectric thin film resonator comprising:
a substrate;
a lower electrode formed on the substrate;
a piezoelectric film formed on the lower electrode; and
an upper electrode formed on the piezoelectric film, the lower electrode and the upper electrode opposing each other through the piezoelectric film to form an opposing region, the opposing region including an insulator of a different acoustic impedance from a acoustic impedance of the piezoelectric film at a boundary of the opposing region, wherein the insulator extending from an inner side to an outer side of the opposing region is formed so as to pass through the piezoelectric film.

11. The piezoelectric thin film resonator according to claim 10, wherein the acoustic impedance of the insulator is smaller than the acoustic impedance of the piezoelectric film.

12. The piezoelectric thin film resonator according to claim 10, wherein the insulator is made of silicon oxide.

13. The piezoelectric thin film resonator according to claim 10, wherein a cavity is formed under the opposing region and an area of the cavity opposing to the opposing region is larger than an area of the opposing region opposing to the cavity.

14. The piezoelectric thin film resonator according to claim 10, wherein the piezoelectric thin film resonator resonates in a thickness extensional mode.

15. A piezoelectric thin film resonator comprising:
a substrate;
a lower electrode formed on the substrate;
a piezoelectric film formed on the lower electrode; and
an upper electrode formed on the piezoelectric film, the lower electrode and the upper electrode opposing each other through the piezoelectric film to form an opposing region, the opposing region including a space at a boundary of the opposing region, wherein the space extending from an inner side to an outer side of the opposing region is formed so as to pass through the piezoelectric film and the upper electrode includes a portion which extends to the outer of the opposing region and opposes to an edge of the lower electrode.

16. The piezoelectric thin film resonator according to claim 15, wherein a cavity is formed under the opposing region and an area of the cavity opposing to the opposing region is larger than an area of the opposing region opposing to the cavity.

17. The piezoelectric thin film resonator according to claim 15, wherein the piezoelectric thin film resonator resonates in a thickness extensional mode.

\* \* \* \* \*